United States Patent [19]
Galbraith et al.

[11] Patent Number: 5,396,130
[45] Date of Patent: Mar. 7, 1995

[54] METHOD AND APPARATUS FOR ADAPTIVE CHIP TRIM ADJUSTMENT

[75] Inventors: Richard L. Galbraith; Christian J. Goetschel; Robert A. Kertis; Rick A. Philpott; Raymond A. Richetta, all of Rochester; Timothy J. Schmerbeck, Kasson; Donald J. Schulte, Rochester; David P. Swart, Pine Island, all of Minn.

[73] Assignee: International Business Machines Corporation, Armonk, N.Y.

[21] Appl. No.: 85,231

[22] Filed: Jun. 29, 1993

[51] Int. Cl.⁶ .................. H01L 25/00; H03K 19/173
[52] U.S. Cl. .................... 326/102; 326/39; 327/543; 327/564
[58] Field of Search ............. 307/202.1, 482.1, 465.1, 307/303, 303.1, 296.8; 324/712

[56] References Cited

U.S. PATENT DOCUMENTS

| | | | |
|---|---|---|---|
| 4,042,830 | 8/1977 | Kellenbenz et al. | 307/40 |
| 4,199,726 | 4/1980 | Bukosky et al. | 328/14 |
| 4,293,916 | 10/1981 | Del Re et al. | 364/571 |
| 4,335,371 | 6/1982 | Connolly, Jr. et al. | 364/571 |
| 4,870,472 | 9/1989 | Vyne | 357/51 |
| 4,922,134 | 5/1990 | Hoffmann et al. | 307/441 |
| 5,023,485 | 6/1991 | Sweeney | 307/465 |
| 5,075,569 | 12/1991 | Branson | 307/270 |
| 5,099,148 | 3/1992 | McClure et al. | 307/443 |
| 5,099,149 | 3/1992 | Smith | 307/465 |
| 5,124,596 | 6/1992 | Wurcer | 307/202.1 |
| 5,180,988 | 1/1993 | McDaniel | 307/296.8 |
| 5,216,385 | 6/1993 | McDaniel | 307/296.8 |
| 5,250,854 | 10/1993 | McDaniel | 307/296.8 |
| 5,252,862 | 10/1993 | Eagan | 307/296.8 |
| 5,254,883 | 10/1993 | Horowitz et al. | 307/296.8 |
| 5,281,906 | 1/1994 | Thelen, Jr. | 307/296.8 |

FOREIGN PATENT DOCUMENTS

| | | |
|---|---|---|
| 0130716 | 1/1985 | European Pat. Off. . |
| 62-200804 | 9/1987 | Japan . |

Primary Examiner—Edward P. Westin
Assistant Examiner—Richard Roseen
Attorney, Agent, or Firm—J. Michael Anglin

[57] ABSTRACT

A method and apparatus are provided for adaptive chip trim adjustment for an integrated circuit. A plurality of switching devices have an unswitched state and a switched state. The unswitched state corresponds to one binary value, and the switched state corresponds to another binary value. A first trim word is provided by sensing the switching devices. The switching devices are temporarily bypassed, and an override bit pattern is supplied to simulate any desired pattern of the switching device states. The override bit pattern is used for simulating a switched or unswitched state for each of the plurality of switching devices.

14 Claims, 3 Drawing Sheets

5,396,130

METHOD AND APPARATUS FOR ADAPTIVE CHIP TRIM ADJUSTMENT

BACKGROUND OF THE INVENTION

1. Field of the Invention

The present invention relates to a method and apparatus for adaptive chip trim adjustment for integrated circuits.

2. Description of the Prior Art

It is desirable to be able to adjust the performance of semiconductor integrated circuits after processing has been completed to minimize variation associated with process tolerance. This adjustment or trimming procedure should be able to be applied to multiple interacting or non-interacting circuits on the same semiconductor die. It is desirable to be able to iterate the adjustment or change it to counteract changes in circuit performance caused by circuit interaction. For example, if circuit A is trimmed before circuit B and the subsequent trimming of circuit B changes the performance of circuit A, it is desirable to iterate circuit A's trim. It is also desirable to accomplish this trim or adjustment without increasing process complexity substantially.

Memory circuits such as a dynamic random access memory (DRAM), and a static random access memory (SRAM) have been a prime technology driver for semiconductor processing. As a result, most modern complementary metal oxide semiconductor (CMOS) and BICMOS processes are derivatives of semiconductor processes developed for memories. Most memory circuits have the capability of using the redundancy fuses needed to replace a bad bank of memory on a chip. These fuses can take the form of metal or polysilicon straps that are blown with a laser or electrically blown. Because of the price sensitivity of memory, fuse blow processes have been optimized for low cost and equipment to blow the fuses is readily available. The problem with the fuses is that they are not iterative in nature.

For iterative trims typically laser trimmed thin-film, thick-film, or nichrome resistors are used. A scheme is developed that senses the resistor resistance and uses the resistance value as a variable to alter the performance of the circuit. Resistor values are usually only increased by trim; but by careful design and order of trim of multiple resistors, iterative trim can be achieved. The thick-film and some of the thin-film resistors cannot be placed on chip and therefore require hybrid packaging. The nichrome resistors can be placed on chip. A problem with the use of trimmed resistors is that the analog value of resistance determines the circuit adjustment, so drift or corrosion of the resistor must be avoided. This process is inherently more expensive than using fuses.

SUMMARY OF THE INVENTION

Important objects of the present invention are to provide an improved method and apparatus for adaptive chip trim adjustment; to provide such an adaptive chip trim adjustment method and apparatus adapted for use with a chip of the type conforming to a Level Sensitive Scan Design (LSSD) system and testing technique or a chip having shift register functions for other reasons so that additional chip I/O pins are not required; and to provide such an adaptive chip trim adjustment method and apparatus that facilitates efficient and reliable operations.

In brief, the objects and advantages of the present invention are achieved by a method and apparatus for adaptive chip trim adjustment for an integrated circuit. A plurality of switching devices have an unswitched state and a switched state. The unswitched state corresponds to one binary value, and the switched state corresponds to another binary value. A first trim word is provided by sensing the switching devices. The switching devices are temporarily bypassed, and an override bit pattern is supplied to simulate any desired pattern of the switching devices. The override bit pattern is used for simulating a switched or unswitched state for each of the plurality of switching devices.

BRIEF DESCRIPTION OF THE DRAWING

The present invention, together with the above and other objects and advantages, can best be understood from the following detailed description of the embodiment of the invention illustrated in the drawing, wherein.

DETAILED DESCRIPTION OF THE PREFERRED EMBODIMENTS

Figure 1:
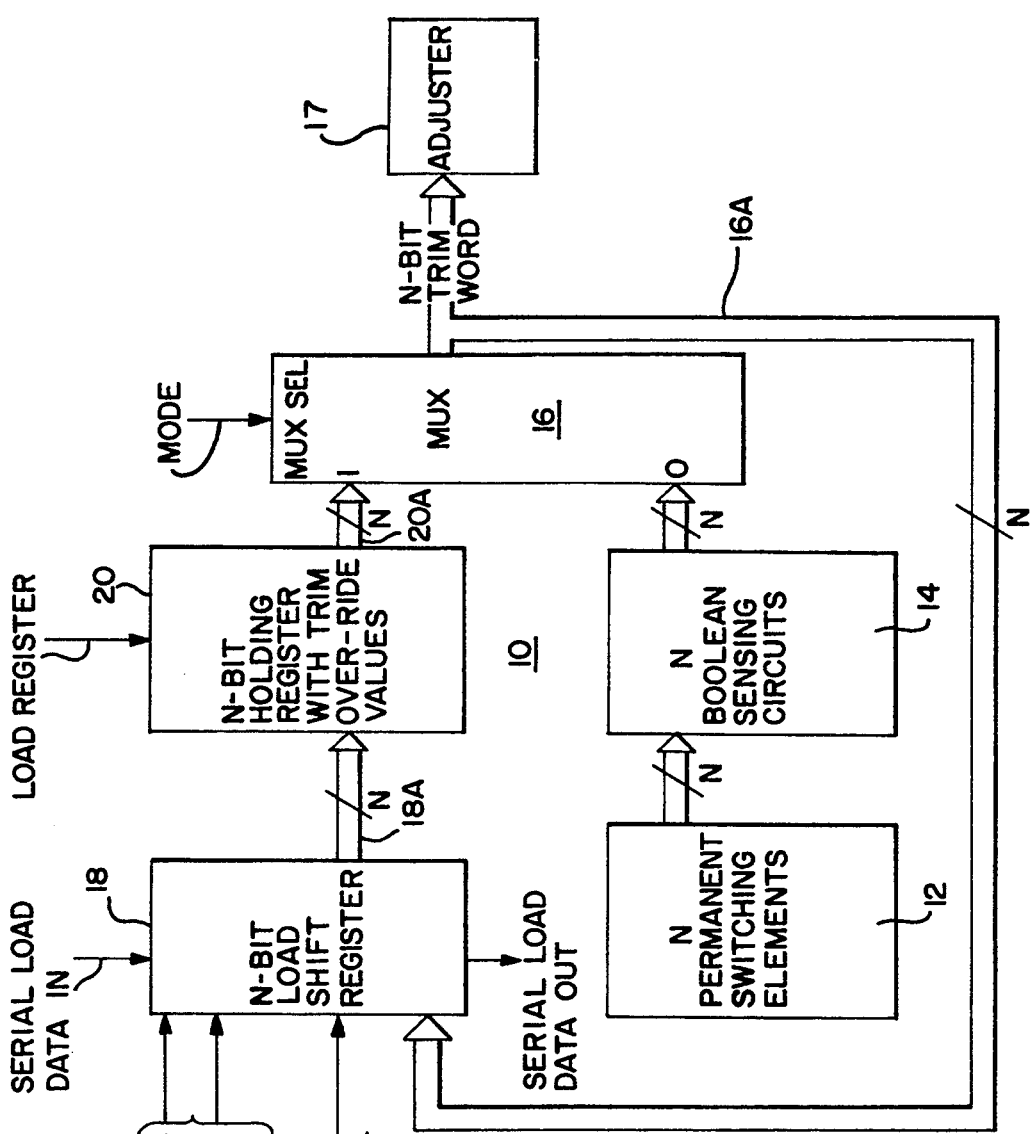
FIG. 1 is a block diagram of circuitry which may be employed in carrying out the adaptive trim adjustment method of the invention.

Referring now to the drawing, in FIG. 1 there is illustrated a block diagram representation of an adaptive trim adjustment apparatus which may be employed in carrying out the adaptive trim adjustment method according to the invention generally designated by the reference numeral 10. As used in the following description and claims, the terms permanent switching element and fuse mean either a shorting device like a zener diode or an opening device like a fuse.

Figure 2:
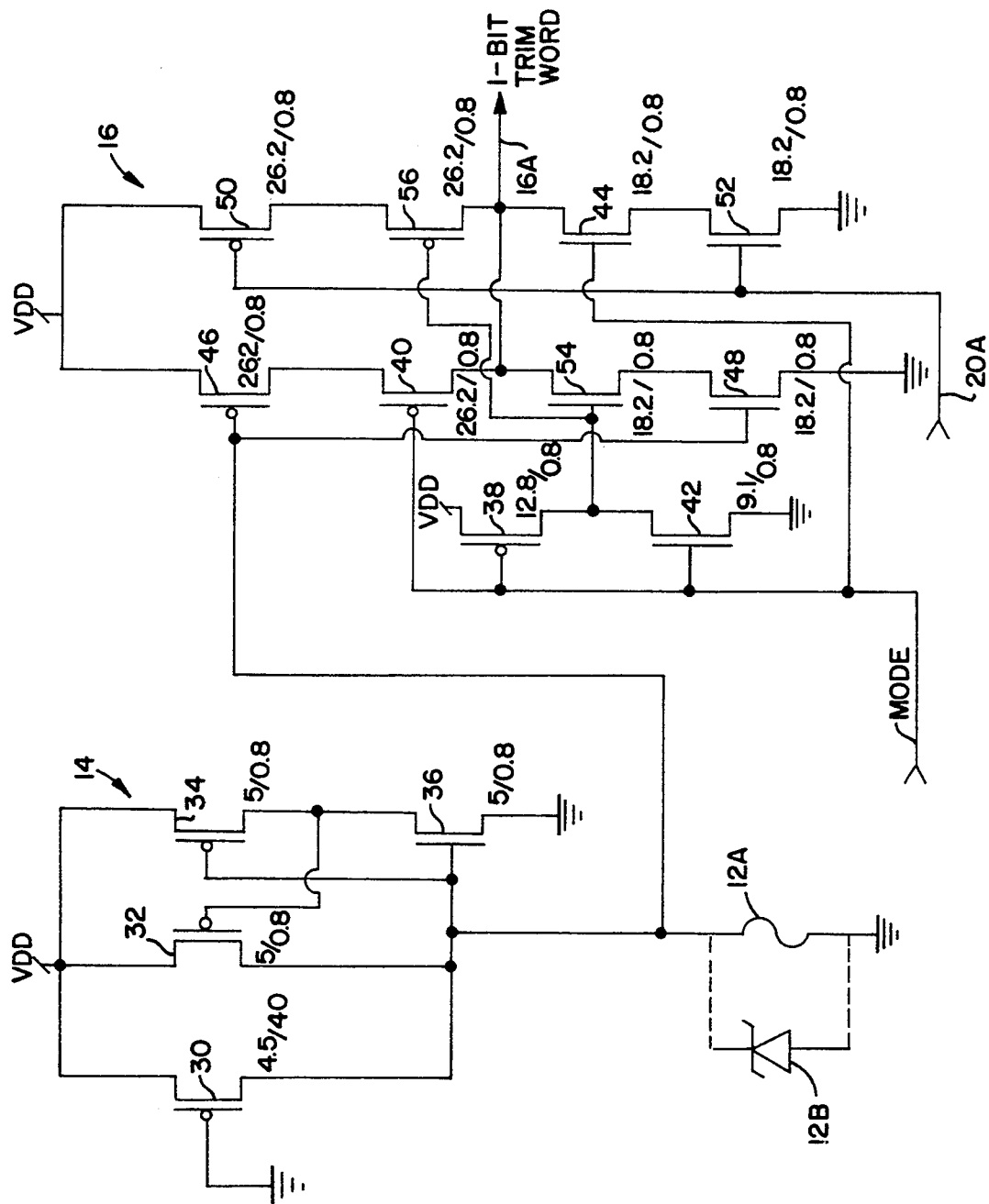
FIG. 2 is a schematic diagram illustrating an exemplar 1-bit fuse, fuse sense, and multiplexer (MUX) implementation for opening or shorting a permanent switching element of the circuitry illustrated in FIG. 1.

In accordance with the invention, a permanent switching element 12 or fuse can be used to produce a Boolean result or trim word for use for adaptive trim adjustment of circuit performance. Permanent switching element 12 is any switch once device such as a laser opened fuse or an electronically shorting zener diode. The permanent switching element 12 must have some electrical parameter that changes value sufficiently between switched and unswitched states to be detected and converted to a binary value of a logic 1 or logic 0. For example, the permanent switching elements 12 can be a laser opened memory redundancy fuse 12A as shown in FIG. 2 and used in various memory processes. An alternative to the fuse 12A is to use a zener diode 12B shown in dotted line in FIG. 2. Zener diode 12B provides a short after electrical stress in contrast to the open for the fuse 12A. Zener 12B generally takes more chip area and is more costly to use than fuse 12A.

A plurality of N permanent switching elements 12 provide an N-bit trim word. Each of the N-bits is applied to a corresponding Boolean sensing circuit and coupled to a first input labelled 0 of a multiplexer 16. Multiplexer 16 normally provides the N-bit trim word or Boolean result at its output at a line labelled 16A. A logic low normally is applied to a multiplexer select input of multiplexer 16 at a line labelled MODE for selecting the sensed N-bit trim word. Each bit of the trim word or Boolean result is either a logic 1 or a logic 0 corresponding to the state of the particular switching element 12. The logic 1 or logic 0 trim bit can be used as a switch to alter a circuit state.

Multiple fuses 12 produce multiple Boolean outputs that can be used to drive a current output digital-to-analog converter (DAC). This current output can be used to adjust or trim circuit performance. In another example, the Boolean outputs or trim word can be used to switch elements such as a resistor or capacitor into or out of a circuit to trim, adjust or affect its performance. In essence, the invention provides a digital form of trim as compared to trimming resistors that provide an analog form of trim.

The N-bit trim word corresponding to the sensed word applied to a multiplexer (MUX) 16 is used to modify analog or digital circuits. A circuit 17 called an adjuster uses the N-bit trim word to modify a desired performance parameter. Adjuster 17 selects a weighted set of currents, voltages or passive elements to be connected to an analog or digital circuit in order to modify or adjust an observable performance parameter of the circuit. By selecting a larger N value, virtually any obtainable resolution is achieved and any number of parameters can be adjusted. An example adjuster 17 is illustrated and described with respect to FIG. 4.

Multiplexer 16 effectively enables an adaptable, reversible and iterative trim. This is accomplished by temporarily bypassing the Boolean sensing circuits 14 that sense the state of fuses 12 and providing an override signal to simulate the effect of blowing various combinations of fuses or opening various combinations of shorting devices to identify the resultant circuit performance changes. The multiplexer 16, placed between the sensed word and the adjuster, allows alternate input to the adjuster. The alternate input allows the optimum digital word for all performance parameters to be determined before switching the switch once permanent switching elements 12.

A logic high multiplexer select input indicated at line MODE controls multiplexer 16 to select the override signal. The override or alternate signal is applied via an N-bit shift register 18 and coupled by an optional N-bit holding register 20 coupled to a second input labelled 1 of the multiplexer 16. Once the optimum combination is determined, the fuses can be blown in that configuration or shorting devices opened in the optimum configuration.

When a chip conforms to a Level Sensitive Scan Design (LSSD) system and testing technique or a chip has shift register functions for other reasons, the available shift registers advantageously are used for the shift register 18 so that additional chip I/O pins are not required. The alternate input at line SERIAL LOAD DATA IN to the N-bit load shift register 18 can be fed from any serial or parallel digital data stream such as a serial shift register that is available in any LSSD design.

Each shift register latch output simulates the state of one fuse 12. By loading shift register 18 with selected values, any combination of fuse blow states can be simulated. The N-bit load shift register 18 includes a serial load data input and output and a parallel load data input and output. The parallel load data output is coupled to the holding register 20 indicated at a line 18A. A mode control logic input of shift register 18 labelled PARALLEL LOAD selects the parallel load input for feedback of the trim word at line 16A output of the multiplexer 16. The trim word feedback allows a first stored trim state to be modified. The state of the sensed word at line 16A can be read out of the same data stream as used for the alternate multiplexer input or a separate data stream to verify correctness. The optional holding register 20 allows a trim state to be held while serial or parallel loading of the shift register 18. Holding register 20 applies the override signal or sequential different trim values to the multiplexer 16. Holding register 20 includes a control input at a line labelled LOAD REGISTER for parallel load or hold state functions.

The optimum combination of the permanent switching elements can be determined by performing an algorithm or sequentially trying all possible combinations of the switching elements 12. The selected permanent switching elements 12 are switched, and then the sensed word is selected for normal operation.

In one preferred application of the invention, sequential steps for trim adjustment include first reading out the sensed word, selecting the alternate multiplexer input path, and then to feed back the sensed word with slight modifications, for example based upon various disk drive conditions to determine an optimum trim adjustment. In this case some blown fuses form a starting trimmed or adjusted state that can be modified if conditions warrant to provide an optimum trim adjustment. The sensed word can also be used to write quality information into the part that can be read out, such as speed sort level and the like.

As illustrated in FIG. 2, the present invention can be used with either an opening device such as the fuse 12A or alternatively a shorting device such as the zener 12B. Example channel width/length values are listed adjacent each transistor in FIGS. 2 and 3 that can be used with a VDD of, for example, plus 3 volts.

A fuse sensing circuit 14 includes a P-channel field effect transistor (FET) 30 for providing a source current to sense the state of the fuse 12A or alternatively the zener 12B and a latch formed by a pair of P-channel FET's 32 and 34 and an N-channel FET 36. The sensed state of fuse 12A is either a logic low or 0 when the fuse is intact or a logic high or 1 after the fuse is blown or modified to an open circuit. When the shorting device zener 12B is used, the sensed state of the zener 12B is either a logic high or 1 when the zener is intact or a logic low or 0 after the zener is zapped or modified to a short circuit.

A multiplexer 16 includes a pair of P-channel FET's 38 and 40 and a pair of N-channel FET's 42 and 44 having a mode control gate input to select a fuse sensing mode or an override fuse state. A logic high mode control gate input overrides the fuse state for trim adjustment. A logic low mode control gate input selects the fuse sense state for normal operation after trim adjustment. The sensed fuse state is applied to a gate input of a P-channel FET 46 and an N-channel FET 48. The override signal input to the multiplexer 16 from the holding register 20 indicated at line 20A is applied to a gate input of a P-channel FET 50 and an N-channel FET 52. The common connection of mode control FET's 38 and 42 are connected to a gate input of an N-channel FET 54 and a P-channel FET 56. A 1-bit trim word output of multiplexer 16, indicated at a line 16A, normally corresponds to the state of the opening or shorting permanent switching element 12A or 12B.

When an override mode is input, then the override signal is provided at the output of multiplexer 16.

Figure 3:
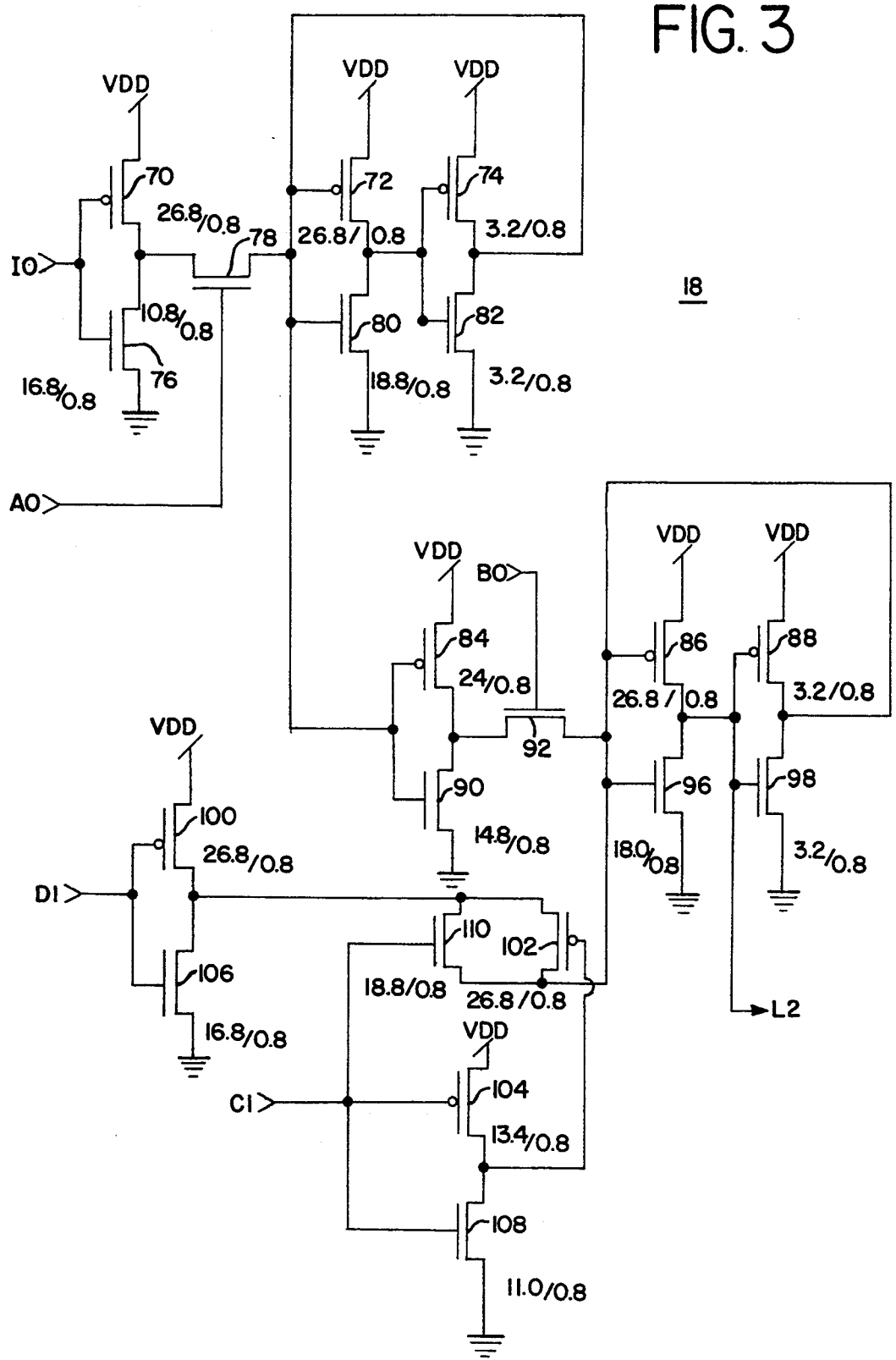
FIG. 3 is a schematic diagram illustrating an exemplar single latch of a parallel/serial load first-in first-out (FIFO) shift register of the circuitry illustrated in FIG. 1.

FIG. 3 provides a schematic diagram illustrating a single latch of a parallel/serial load first-in first-out (FIFO) shift register 18. A master latch includes a plurality of P-channel FET's 70, 72 and 74 and a plurality of N-channel FET's 76, 78, 80 and 82. A serial load data pattern is applied to the gate input labelled I0 of P-channel FET 70 and N-channel FET 76 and a serial load master clock is applied to the gate input labelled A0 of N-channel FET 78. A slave latch includes a plurality of P-channel FET's 84, 86 and 88 and a plurality of N-channel FET's 90, 92, 96 and 98. A serial load slave clock is applied to the gate input labelled B0 of N-channel FET 92. Shift register 18 includes a parallel load portion including a plurality of P-channel FET's 100, 102 and 104 and a plurality of N-channel FET's 106, 108 and 110. A parallel load data input labelled D1 is applied to the gate input of FET's 100 and 106 and a parallel load clock input labelled C1 is applied to the gates of FET's 104, 108 and 110. A true latch parallel output labelled L2 is fed to a next latch I0 input to produce the shift register FIFO.

Figure 4:
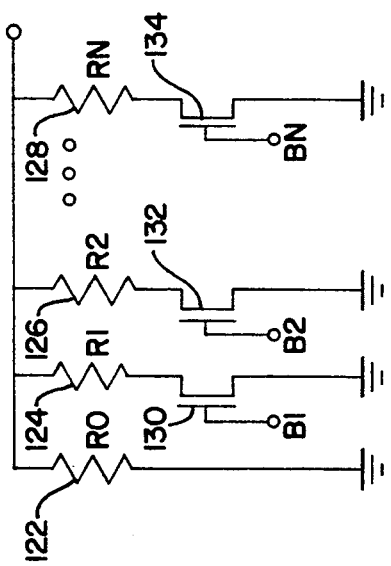
FIG. 4 is a schematic diagram illustrating an exemplar adjuster of the circuitry illustrated in FIG. 1.

FIG. 4 provides a schematic diagram illustrating an example adjuster 17 including a plurality of resistors 122, 124, 126 and 128 (R0, R1, R2 ... RN) and a plurality of N-channel FET's 130, 132 and 134 (B1, B2 BN). Each of the N-bits B1, B2 ... BN of the N-bit trim word is applied to a corresponding gate input of FET's B1, B2 ... BN. The selected value of the N-bit trim word enables adjustment of resistor 122 by a particular parallel combination of resistors R1, R2 ... RN enabled by a particular N-bit trim word.

While the invention has been described with reference to details of the illustrated embodiments, these details are not intended to limit the scope of the invention as defined in the appended claims.

We claim:

1. Apparatus for adaptive chip trim adjustment for an integrated circuit comprising:
    a plurality of switching means for switching from an unswitched state to a switched state, said unswitched state corresponding to one binary value and said switched state corresponding to another binary value;
    means for sensing said switching means for providing a first trim word;
    means utilizing said first trim word for adjusting a predefined chip parameter;
    means for temporarily bypassing said sensing means; and
    means coupled to said bypassing means for supplying an override signal used for selecting a switched or unswitched state for each of said plurality of switching means.

2. Apparatus as recited in claim 1 wherein said switching means include a selected number N of permanent switching devices.

3. Apparatus as recited in claim 1 wherein said switching means include a plurality of fuses.

4. Apparatus as recited in claim 1 wherein said bypassing means include a multiplexer having mode control means for selecting said first trim word from said sensing means or said override signal from said override signal supplying means.

5. Apparatus as recited in claim 1 wherein said sensing means include at least one transistor.

6. Apparatus as recited in claim 5 wherein said at least one transistor is a field effect transistor.

7. Apparatus as recited in claim 1 wherein said bypassing means includes a plurality of transistors.

8. Apparatus as recited in claim 7 wherein said transistors comprise field effect transistors.

9. Apparatus as recited in claim 1 wherein said override signal supplying means comprise a shift register.

10. Apparatus as recited in claim 1 wherein said override signal supplying means comprise a Level Sensitive Scan Design (LSSD) serial shift register.

11. Apparatus as recited in claim 1 wherein said override signal supplying means include means for sequentially supplying a plurality of different trim words.

12. Apparatus as recited in claim 11 further include feedback means from said bypassing means for applying said trim word to said override signal supplying means.

13. A method for adaptive chip trim adjustment for an integrated circuit comprising the steps of:
    providing a group of N permanent switching elements;
    sensing said switching elements for providing a first N-bit binary trim word;
    adjusting predefined chip parameter using said first N-bit binary trim word;
    temporarily bypassing said switching elements; and
    supplying an override signal used for simulating a switched or unswitched state for each of said group of N permanent switching elements.

14. A method as recited in claim 13 wherein said step of supplying an override signal includes the steps of sequentially supplying a plurality of different trim words.

* * * * *